(12) United States Patent
Otsubo et al.

(10) Patent No.: US 9,241,402 B2
(45) Date of Patent: Jan. 19, 2016

(54) FLEXIBLE MULTILAYER SUBSTRATE

(71) Applicant: Murata Manufacturing Co., Ltd., Nagaokakyo-shi, Kyoto-fu (JP)

(72) Inventors: Yoshihito Otsubo, Nagaokakyo (JP); Takashi Osawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 62 days.

(21) Appl. No.: 14/143,467

(22) Filed: Dec. 30, 2013

(65) Prior Publication Data
US 2014/0110155 A1   Apr. 24, 2014

Related U.S. Application Data

(63) Continuation of application No. PCT/JP2012/065218, filed on Jun. 14, 2012.

(30) Foreign Application Priority Data

Jul. 5, 2011   (JP) .................... 2011-149124

(51) Int. Cl.
H05K 1/02      (2006.01)
H05K 7/06      (2006.01)
H05K 3/46      (2006.01)

(52) U.S. Cl.
CPC .............. *H05K 1/0283* (2013.01); *H05K 1/028* (2013.01); *H05K 3/4635* (2013.01); *H05K 2201/0191* (2013.01); *H05K 2201/09227* (2013.01);
(Continued)

(58) Field of Classification Search
CPC ................................. H05K 7/06; H05K 1/0283
USPC .................................................. 174/251, 260
See application file for complete search history.

(56) References Cited

U.S. PATENT DOCUMENTS 6,444,921 B1 *  9/2002  Wang et al. .................... 174/260
6,737,589 B2 *  5/2004  Adachi et al. .................. 174/254
(Continued)

FOREIGN PATENT DOCUMENTS

JP  08-330683 A  12/1996
JP  11-121881 A   4/1999
(Continued)

OTHER PUBLICATIONS

Official Communication issued in International Patent Application No. PCT/JP2012/065218, mailed on Jul. 24, 2012.

*Primary Examiner* — Timothy Thompson
*Assistant Examiner* — Michael F McAllister
(74) *Attorney, Agent, or Firm* — Keating & Bennett, LLP (57) ABSTRACT

A flexible multilayer substrate includes a stacked body including a plurality of stacked resin layers and defining a flexible portion. The stacked body includes an innermost surface located inside and an outermost surface located outside when the stacked body is bent in use. A plurality of conductor patterns are arranged inside the stacked body to be distributed over a surface of one or more of the plurality of resin layers. A portion located on the innermost surface side with respect to a center plane of the stacked body in a thickness direction is a first portion, and a portion located on the outermost surface side with respect to the center plane is a second portion. An area having a minimum spacing along the longitudinal direction between the conductor patterns arranged in the same plane, in all of the plurality of resin layers, is located in the second portion.

14 Claims, 6 Drawing Sheets

(52) U.S. Cl.
CPC ........... *H05K2201/09727* (2013.01); *H05K 2201/09736* (2013.01)

(56) References Cited

U.S. PATENT DOCUMENTS 7,812,440 B2 * 10/2010 Yamazaki et al. ............ 257/701

2003/0116343 A1    6/2003   Adachi et al.

FOREIGN PATENT DOCUMENTS

| JP | 11-204898 A | 7/1999 |
| JP | 2003-179317 A | 6/2003 |
| JP | 2011-023521 A | 2/2011 |

* cited by examiner

FLEXIBLE MULTILAYER SUBSTRATE

BACKGROUND OF THE INVENTION

1. Field of the Invention

The present invention relates to a flexible multilayer substrate.

2. Description of the Related Art

A substrate referred to as a "flexible multilayer substrate" may be used in some cases in a mobile phone, a digital camera and the like, for example. The flexible multilayer substrate includes at least a flexible portion. The flexible multilayer substrate may also include both a rigid portion and the flexible portion. Such a flexible multilayer substrate including both the rigid portion and the flexible portion is also called a "rigid-flexible multilayer substrate". The flexible portion of the flexible multilayer substrate is formed by stacking one or more soft insulating layers. A resin layer is used as the soft insulating layer.

The flexible multilayer substrate is used in some cases in a portion where bending occurs within some kind of device in use. The flexible multilayer substrate is also used in some cases in a portion that needs to be bent and attached during assembly, even if the portion is immobile in use.

A conductor pattern such as a wiring is arranged in some cases inside the flexible portion of the flexible multilayer substrate. One example of the flexible multilayer substrate is disclosed in Japanese Patent Laying-Open No. 8-330683. The flexible multilayer substrate disclosed in this document is a rigid-flexible multilayer substrate. In the example disclosed in this document, the flexible portion is formed by a film made of polyimide. Inside the flexible portion as well, a conductor pattern, i.e., a copper foil pattern, serving as the wiring is laid. The conductor pattern is normally formed by a metal pattern. The flexible portion may be formed by arranging the metal pattern on a surface of a resin layer and stacking one or more resin layers.

In recent years, it has been desired to increase the number of conductor patterns arranged in the flexible portion of the flexible multilayer substrate. However, the flexible portion is a portion that is bent in use, and the resin layer itself and the conductor pattern are different in bendability. Therefore, if too many conductor patterns are provided inside the flexible portion, the conductor patterns may come into contact with each other and short circuit may occur when the flexible portion is bent.

SUMMARY OF THE INVENTION

Thus, preferred embodiments of the present invention provide a flexible multilayer substrate that achieves a reduced probability that conductor patterns come into contact with each other and that a short circuit occurs at a time of bending deformation even when many conductor patterns are provided inside a flexible portion.

A flexible multilayer substrate according to a preferred embodiment of the present invention includes a stacked body including a plurality of stacked resin layers, extending in a longitudinal direction and defining a flexible portion, wherein the stacked body includes an innermost surface that is a surface located inside when both ends in the longitudinal direction are bent to come closer to each other in use, and an outermost surface that is a surface located outside when both ends in the longitudinal direction are bent to come closer to each other in use, a plurality of conductor patterns are arranged inside the stacked body to be distributed over a surface of one or more of the plurality of resin layers, and assuming that a portion located on the innermost surface side with respect to a center plane of the stacked body in a thickness direction is referred to as a first portion, and a portion located on the outermost surface side with respect to the center plane is referred to as a second portion, an area having a minimum spacing along the longitudinal direction between the conductor patterns arranged in the same plane, in all of the plurality of resin layers, is located in the second portion.

According to various preferred embodiments of the present invention, the area having a minimum spacing along the longitudinal direction between the conductor patterns arranged in the same plane is located in the second portion that defines the outside of bending when the stacked body is bent. Therefore, it is possible to reduce a probability that the conductor patterns come into contact with each other and that a short circuit occurs at the time of bending deformation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In order to obtain a flexible multilayer substrate, it is conceivable, for example, that a resin sheet (hereinafter referred to as "resin sheet with copper foil") having copper foil attached to one surface thereof is prepared, the copper foil is patterned, the resin sheet is cut into pieces of the resin sheet having a required shape, and a plurality of these pieces are stacked as resin layers. Alternatively, it is also conceivable that copper foil is patterned and then stacked, and then the stacked body as a whole is cut to thus cut out so that the stacked body has a required shape.

Generally, in the commercially available resin sheet with copper foil, a surface where the copper foil and the resin layer are bonded together has large surface roughness in order to enhance the adhesion between the copper foil and the resin layer.

First Preferred Embodiment

Figure 1:
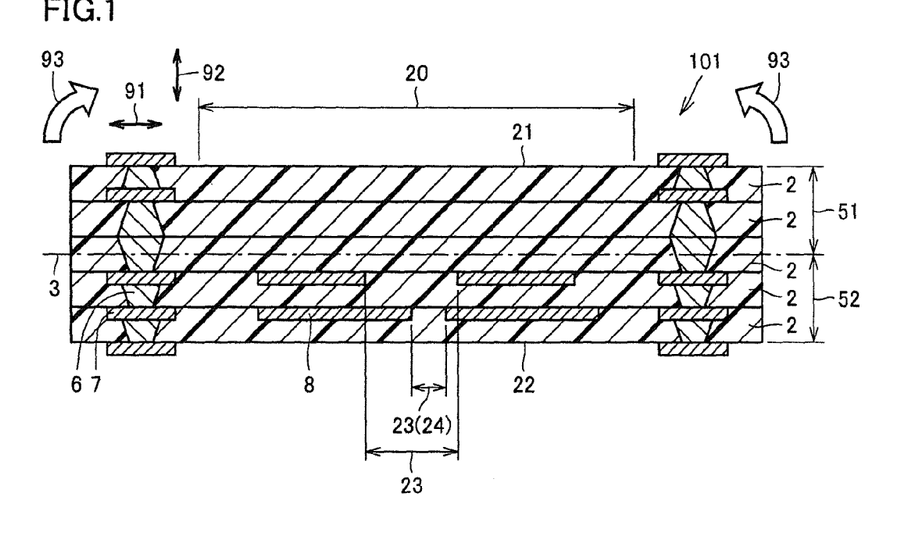
FIG. 1 is a cross-sectional view of a flexible multilayer substrate according to a first preferred embodiment of the present invention.

A flexible multilayer substrate according to a first preferred embodiment of the present invention will be described with reference to FIG. 1. As shown in FIG. 1, a flexible multilayer substrate 101 according to the present preferred embodiment includes a stacked body 20 including a plurality of stacked resin layers 2, extending in a longitudinal direction 91 and defining a flexible portion. Although a portion except for both ends is regarded as the flexible portion in the example shown in FIG. 1, the whole may be regarded as the flexible portion. Stacked body 20 includes an innermost surface 21 that is a surface located inside when both ends in longitudinal direction 91 are bent to come closer to each other, i.e., in the direction of an arrow 93 in use, and an outermost surface 22 that is a surface located outside when both ends in longitudinal direction 91 are bent to come closer to each other, i.e., in the direction of arrow 93 in use. A plurality of conductor patterns 8 are arranged inside stacked body 20 to be distributed over a surface of one or more resin layers 2, of the plurality of resin layers 2. It is assumed that a portion located on the innermost surface 21 side with respect to a center plane 3 of stacked body in a thickness direction 92 is referred to as a "first portion" 51, and a portion located on the outermost surface 22 side with respect to center plane 3 is referred to as a "second portion" 52. An area 24 having a minimum spacing 23 along longitudinal direction 91 between conductor patterns 8 arranged in the same plane, in all of the plurality of resin layers 2, is located in second portion 52. "In the same plane" herein refers to the same surface of the same resin layer 2.

FIG. 1 merely shows the flexible multilayer substrate cut at one cross section. Each conductor pattern 8 arranged inside stacked body 20 that defines the flexible portion may have a complicated shape when viewed two-dimensionally. The same may be applied as well to preferred embodiments described below.

In the present preferred embodiment, the area 24 having minimum spacing 23 along longitudinal direction 91 between conductor patterns 8 arranged in the same plane does not refer to an area where spacing 23 is minimum in one cross section, but refers to an area where spacing 23 along longitudinal direction 91 between conductor patterns 8 arranged in the same plane is minimum inside stacked body 20 as a whole when viewed three-dimensionally. Such area is located in second portion 52.

In the example shown in FIG. 1, a conductor pattern 7 is arranged in a portion other than the flexible portion, and a via conductor 6 to electrically connect conductor patterns 7 in the thickness direction is provided. This is merely one example simplified and shown for convenience in description. In the example shown in FIG. 1, the plurality of conductor patterns 8 may also be electrically connected in the thickness direction by a via conductor (not shown). The same is applied as well to the preferred embodiments described below.

In the present preferred embodiment, area 24 having minimum spacing 23 along longitudinal direction 91 between conductor patterns 8 arranged in the same plane, in all of the plurality of resin layers 2, is located in second portion 52. In other words, the area where short circuit is most likely to occur at the time of bending is located in second portion 52. Since second portion 52 is a portion that enters a tensile state at the time of bending, area 24 enters the tensile state, not a compressed state, and thus, the occurrence of a short circuit is reliably prevented.

Figure 2:
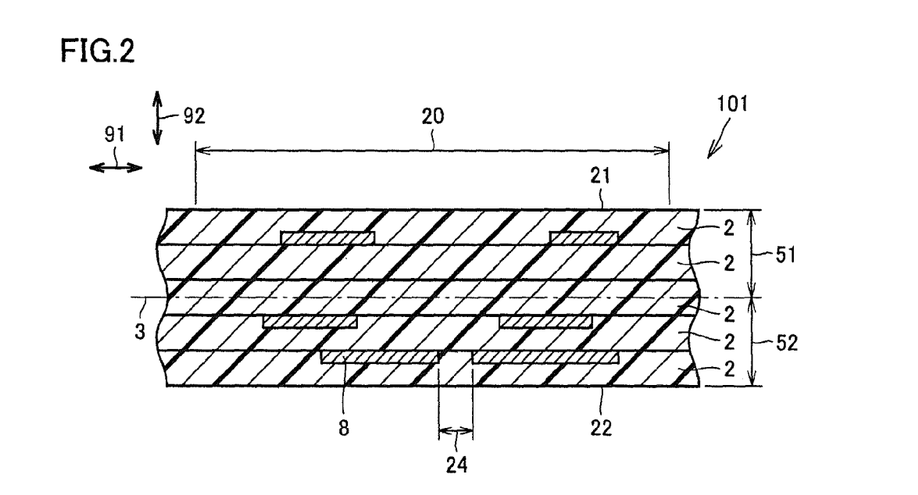
FIG. 2 is a partial cross-sectional view of a first modification of the flexible multilayer substrate according to the first preferred embodiment of the present invention.

In the example shown in FIG. 1, conductor patterns 8 are distributed only in second portion 52 and there are no conductor patterns 8 in first portion 51. However, as shown in FIG. 2, conductor patterns 8 may be arranged in both of first portion 51 and second portion 52. In this case as well, area 24 having the minimum spacing along longitudinal direction 91 may be located in second portion 52.

Figure 3:
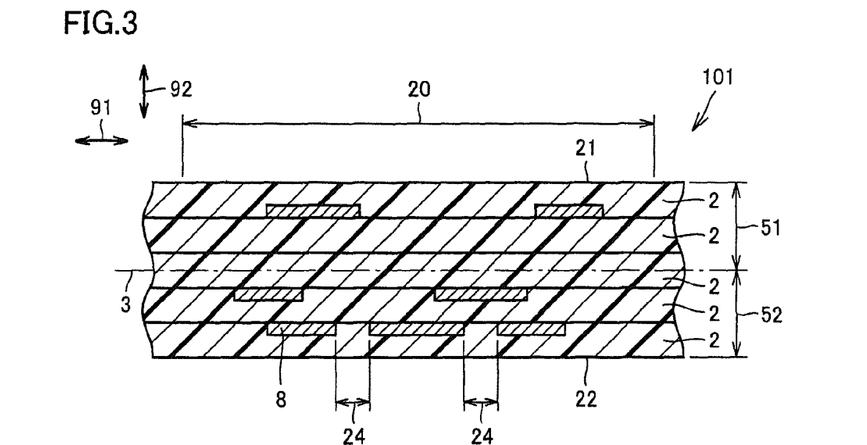
FIG. 3 is a partial cross-sectional view of a second modification of the flexible multilayer substrate according to the first preferred embodiment of the present invention.

As shown in FIG. 3, there may be a plurality of areas 24 having the minimum spacing along longitudinal direction 91.

By determining an arrangement of conductor patterns 8 based on the novel concepts of the present preferred embodiment, there can be provided a flexible multilayer substrate with reduced probability that conductor patterns 8 come into contact with each other and that a short circuit occurs at the time of bending deformation even when many conductor patterns 8 are provided inside the flexible portion.

Second Preferred Embodiment

Generally, the resin layer of the commercially available resin sheet with copper foil is fabricated by stretching. In order to make the resin layer thin, the degree of stretching must be increased. As the degree of stretching is increased, the crystallinity of the resin layer increases and the breakdown strength of the resin layer increases.

When the resin sheet of the resin sheet with copper foil is made of an LCP (liquid crystal polymer) resin, a skin layer is present as an outermost layer. When the sheet becomes thin, a ratio of the thickness of the skin layer in the resin sheet becomes higher because a core layer located on the inner side more than the skin layer is stretched and the skin layer located as the outermost layer is not stretched easily. As the ratio of the skin layer becomes higher, the breakdown strength increases. In the case of the LCP resin, the ratio of the skin layer becoming higher causes the breakdown strength to increase. In other words, the latter of the following two cases applies to the LCP resin: the case in which, by simple stretching, the crystallinity increases, and as a result, the breakdown strength increases; and the case in which, by stretching, the ratio of the skin layer having high crystallinity becomes higher than the ratio of the core layer, and as a result, the breakdown strength increases.

Considering that the stacked body is formed by stacking the resin layers cut out from the resin sheet, the ratio of the thickness of the skin layer in a portion forming the outside of bending becomes higher when the thin resin layer is located on the outside of bending, even if the total thickness of the stacked body obtained by stacking the plurality of layers is the same. Therefore, the breakdown strength against tension in the portion that defines the outside of bending increases.

Normally, resins are known to be resistant to compression and to be vulnerable to tension, and thus, it is desirable to increase the breakdown strength of the portion defining the outside of bending that enters the tensile state. In both cases of the ordinary resin layer and the resin layer made of the LCP resin as described above, the breakdown strength increases as a whole when the thin resin layer is located on the outside of bending.

A second preferred embodiment of the present invention is configured in consideration of the above.

A flexible multilayer substrate according to the second preferred embodiment of the present invention will be described with reference to FIGS. 4 and 5. A flexible multilayer substrate 102 according to the present preferred embodiment basically has the configuration described in the first preferred embodiment, and further has a configuration described below. In flexible multilayer substrate 102 according to the present preferred embodiment, the plurality of resin layers 2 include a resin layer 2a having a first thickness and a resin layer 2b having a second thickness larger than the first thickness. Among the plurality of resin layers 2 included in stacked body 20, resin layer 2a having the first thickness is arranged closest to outermost surface 22. Furthermore, inside stacked body 20, all of resin layers 2b having the second thickness are arranged closer to innermost surface 21 than all of resin layers 2a having the first thickness. In the example shown in FIGS. 4 and 5, thinner first resin layer 2a is arranged to be located on the outermost side at the time of bending.

Figure 4:
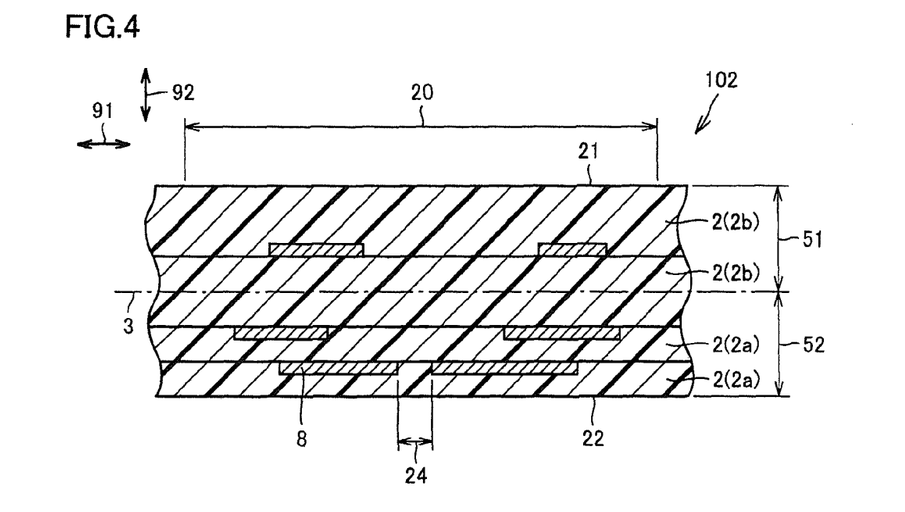
FIG. 4 is a partial cross-sectional view of a flexible multilayer substrate according to a second preferred embodiment of the present invention.
Figure 5:
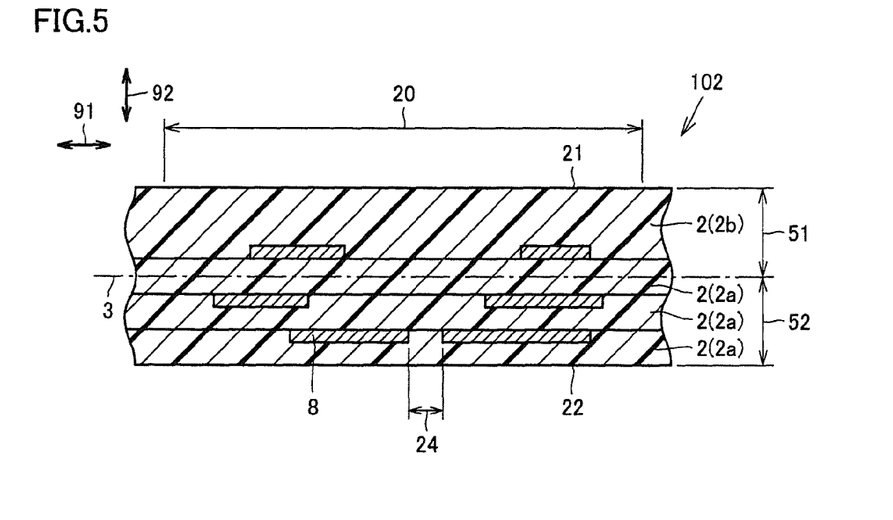
FIG. 5 is a partial cross-sectional view of a modification of the flexible multilayer substrate according to the second preferred embodiment of the present invention.

In FIG. 4, stacked body 20 includes a plurality of resin layers 2b having the second thickness. However, as shown in FIG. 5, stacked body 20 may include only one resin layer 2b having the second thickness.

In the present preferred embodiment as well, the effect described in the first preferred embodiment can be obtained. Furthermore, in the present preferred embodiment, the resin layers with reduced thickness obtained from the stretched resin sheet are unevenly distributed on the outside of bending as compared with on the inside of bending, and thus, the breakdown strength can be increased as a whole.

Third Preferred Embodiment

Figure 6:
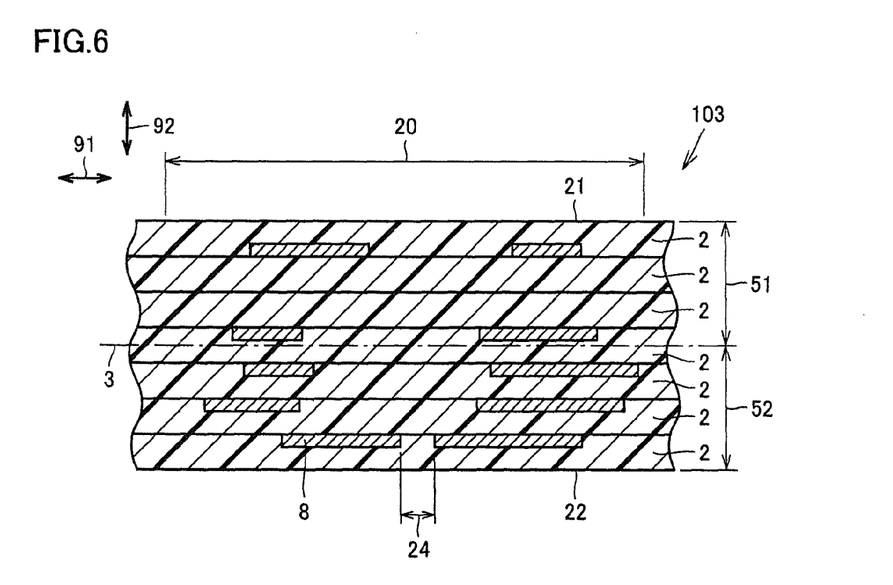
FIG. 6 is a partial cross-sectional view of a flexible multilayer substrate according to a third preferred embodiment of the present invention.

A flexible multilayer substrate according to a third preferred embodiment of the present invention will be described with reference to FIG. 6. A flexible multilayer substrate 103 according to the present preferred embodiment basically has the configuration described in the first preferred embodiment, and further has a configuration described below. In flexible multilayer substrate 103 according to the present preferred embodiment, conductor patterns 8 arranged in two or more different layers are distributed in each of first portion 51 and second portion 52. A distance between conductor patterns 8 in thickness direction 92 is longer in first portion 51 than in second portion 52.

In the present preferred embodiment as well, the effect described in the first preferred embodiment is obtained. Furthermore, in the present preferred embodiment, the distance between conductor patterns 8 in thickness direction 92 is longer in first portion 51 that is located inside and enters the compressed state at the time of bending than in second portion that is located outside. Therefore, there is provided a flexible multilayer substrate with reduced probability that conductor patterns 8 spaced apart from each other in thickness direction 92 come into contact with each other and short circuit occurs at the time of bending deformation.

Fourth Preferred Embodiment

A flexible multilayer substrate according to a fourth preferred embodiment of the present invention will be described with reference to FIG. 7. A flexible multilayer substrate 104 according to the present preferred embodiment basically has the configuration described in the first preferred embodiment, and further has a configuration described below. In flexible multilayer substrate 104 according to the present preferred embodiment, one or more of conductor patterns 8 is/are distributed in each of first portion 51 and second portion 52. A conductor pattern 8x thicker than any of conductor patterns 8 located in first portion 51 is arranged in second portion 52.

Figure 7:
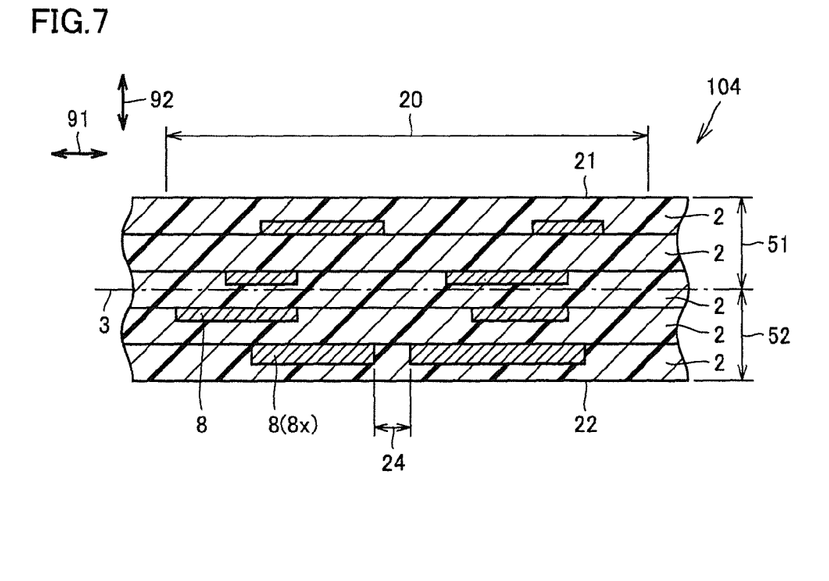
FIG. 7 is a partial cross-sectional view of a flexible multilayer substrate according to a fourth preferred embodiment of the present invention.
Figure 8:
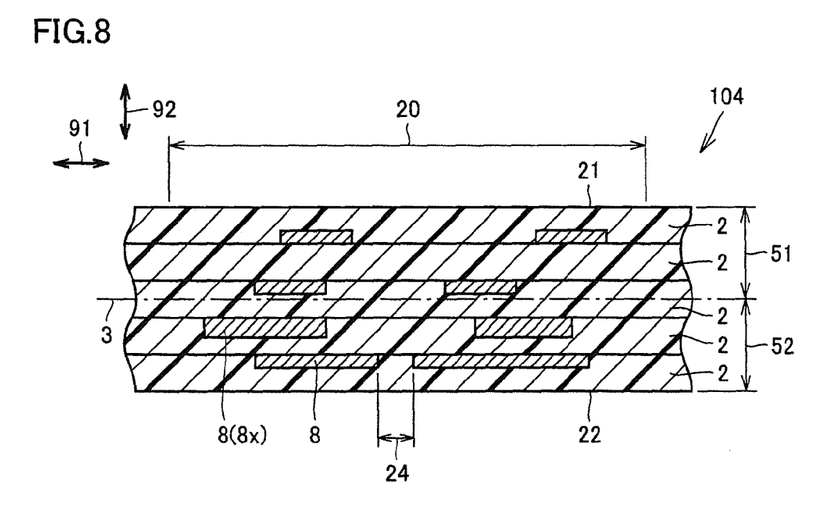
FIG. 8 is a partial cross-sectional view of a modification of the flexible multilayer substrate according to the fourth preferred embodiment of the present invention.

In the example shown in FIG. 7, conductor pattern 8x is located closest to outermost surface 22 as compared with other conductor patterns 8. However, as shown in FIG. 8, conductor pattern 8x may be located at a position that is not necessarily closest to outermost surface 22. It is to be noted that conductor pattern 8x is located inside second portion 52.

In the present preferred embodiment as well, the effect described in the first preferred embodiment can be obtained. Furthermore, in the present preferred embodiment, conductor pattern 8x thicker than other conductor patterns 8 is included inside second portion 52 that is located outside at the time of bending, and thus, the rigidity of stacked body 20 as a whole is increased due to this conductor pattern 8x. This is because the rigidity increases as the thickness of the conductor pattern increases. As the rigidity of stacked body 20 as a whole increases, excessive bending deformation becomes less likely to occur. Therefore, there is provided a flexible multilayer substrate with reduced probability that conductor patterns 8 come into contact with each other and that a short circuit occurs at the time of bending deformation.

In each of the aforementioned preferred embodiments, a density of conductor patterns 8 located in second portion 52 is preferably higher than a density of conductor patterns 8 located in first portion 51. For example, at least the examples shown in FIGS. 2, 3, 4, 5, and 6 satisfy this condition. Since conductor patterns 8 are arranged at a high density in second portion 52 that defines the outside of bending when stacked body 20 is bent, the rigidity of second portion 52 increases accordingly and the rigidity of stacked body 20 as a whole increases.

In other words, it is preferable that required conductor patterns 8 are unevenly distributed, as densely as possible, in second portion 52 that defines the outside of bending when stacked body 20 is bent, and are unevenly distributed, as sparsely as possible, in first portion 51 that defines the inside of bending when stacked body 20 is bent. The reason for this is that a short circuit is less likely to occur when conductor patterns 8 are distributed in first portion 51 as sparsely as possible, because second portion 52 enters the tensile state while first portion 51 enters the compressed state when stacked body 20 is bent.

"Density" of conductor patterns 8 herein refers to the density of conductor patterns 8 arranged inside stacked body 20 when viewed three-dimensionally, not the apparent density of conductor patterns 8 seen in one cross section.

In each of the aforementioned preferred embodiments, the number of conductor patterns 8 located in second portion 52 is preferably larger than the number of conductor patterns 8 located in first portion 51. Since many conductor patterns 8 are arranged in second portion 52 that defines the outside of bending when stacked body 20 is bent, the rigidity of second portion 52 increases accordingly, and thus, the rigidity of stacked body 20 as a whole increases.

Although the case in which stacked body 20 is a central portion of the flexible multilayer substrate has been described in each of the aforementioned preferred embodiments, the entire flexible multilayer substrate may be stacked body 20.

Although the case in which the number of resin layers 2 included in stacked body 20 is 5 to 7 has been described in each of the aforementioned preferred embodiments, the number of resin layers 2 included in stacked body 20 may be larger or smaller.

As a matter common to each of the aforementioned preferred embodiments, one example of a method for manufacturing the flexible multilayer substrate to which various preferred embodiments of the present invention is applied will be described hereinafter with reference to FIGS. 9 to 14.

Figure 9:
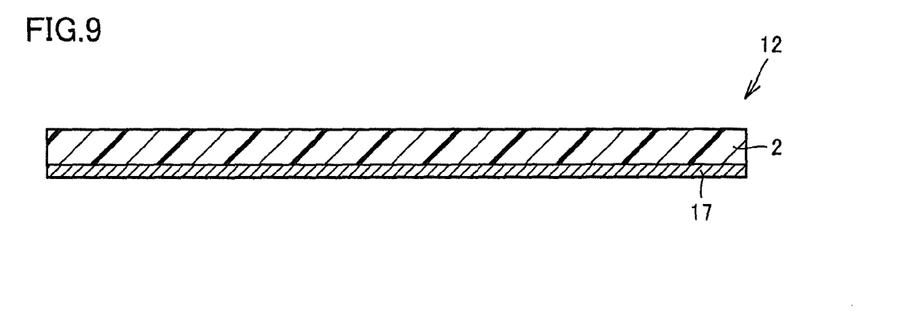
FIG. 9 is a first diagram for describing a method for manufacturing the flexible multilayer substrate according to another preferred embodiment of the present invention.

First, a resin sheet 12 with conductor foil shown in FIG. 9 is prepared. Resin sheet 12 with conductor foil is a sheet having such a structure that conductor foil 17 is attached to one surface of resin layer 2. Resin layer 2 is made of, for example, LCP (liquid crystal polymer) that is a thermoplastic resin. In addition to LCP, resin layer 2 may be made of PEEK (polyether ether ketone), PEI (polyetherimide), PPS (polyphenylene sulfide), PI (polyimide) and the like. Conductor foil 17 is, for example, foil made of Cu and having a thickness of 18 μm. In addition to Cu, conductor foil 17 may be made of Ag, Al, SUS, Ni, and Au, or may be made of an alloy of two or more different metals selected from these metals. Although conductor foil 17 preferably has a thickness of, for example, about 18 μm in the present preferred embodiment, conductor foil 17 may have a thickness of approximately 3 μm or more and approximately 40 μm or less, for example. Conductor foil 17 may have any thicknesses as long as circuit formation is possible.

When resin sheet 12 with conductor foil is prepared, a plurality of resin sheets 12 with conductor foil may be prepared. Alternatively, one resin sheet 12 with conductor foil, which has regions that will be subsequently cut out individually as a plurality of resin sheets, may be prepared.

Figure 10:
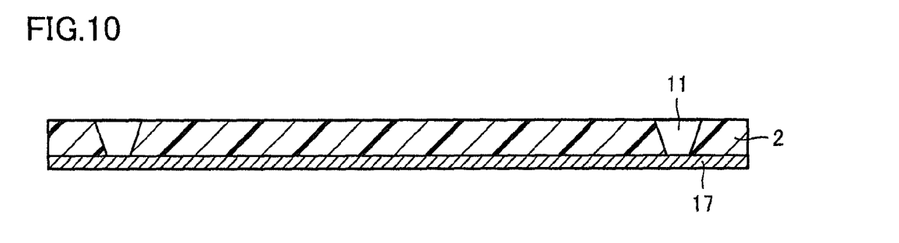
FIG. 10 is a second diagram for describing the method for manufacturing the flexible multilayer substrate according to another preferred embodiment of the present invention.

Next, as shown in FIG. 10, a surface on the resin layer 2 side of resin sheet 12 with conductor foil is irradiated with a carbon dioxide gas laser beam and a via hole 11 is formed to pass through resin layer 2. Via hole 11 passes through resin layer 2, while via hole 11 does not pass through conductor foil 17. Thereafter, a smear (not shown) on via hole 11 is removed. Although the carbon dioxide gas laser beam is used here to form via hole 11, the other type of laser beam may be used. A method other than the laser beam irradiation may also be used to form via hole 11. Via hole 11 is provided to subsequently form the via conductor.

Figure 11:
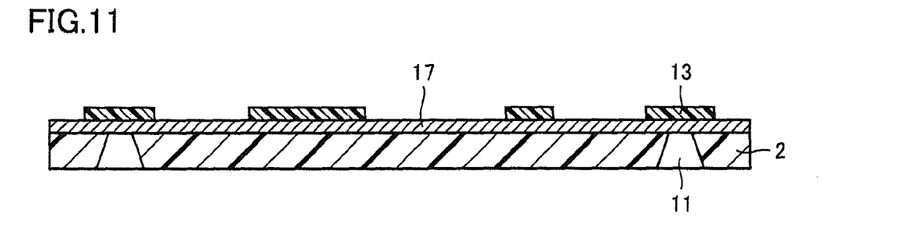
FIG. 11 is a third diagram for describing the method for manufacturing the flexible multilayer substrate according to another preferred embodiment of the present invention.

Next, as shown in FIG. 11, a resist pattern 13 corresponding to a desired circuit pattern is printed on a surface of conductor foil 17 of resin sheet 12 with conductor foil by using a method such as screen printing.

Figure 12:
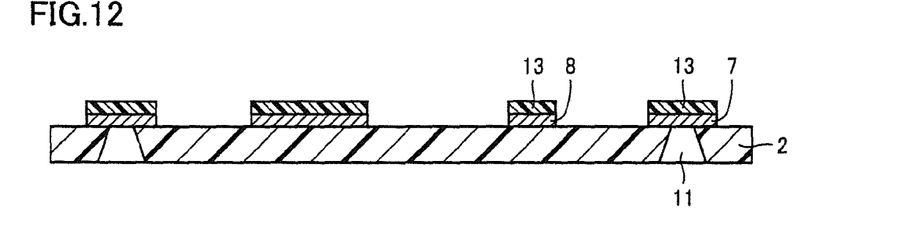
FIG. 12 is a fourth diagram for describing the method for manufacturing the flexible multilayer substrate according to another preferred embodiment of the present invention.
Figure 13:
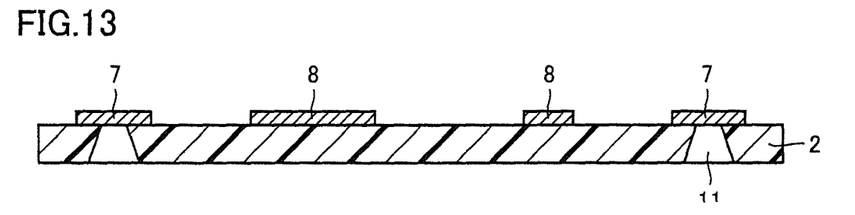
FIG. 13 is a fifth diagram for describing the method for manufacturing the flexible multilayer substrate according to another preferred embodiment of the present invention.

Next, etching is performed by using resist pattern 13 as a mask, and a portion of conductor foil 17 that is not covered with resist pattern 13 is removed as shown in FIG. 12. A portion of conductor foil 17 left after this etching forms conductor pattern 7 or conductor pattern 8. Thereafter, as shown in FIG. 13, resist pattern 13 is removed. Desired conductor patterns 7 and 8 are thus obtained on one surface of resin layer 2.

Figure 14:
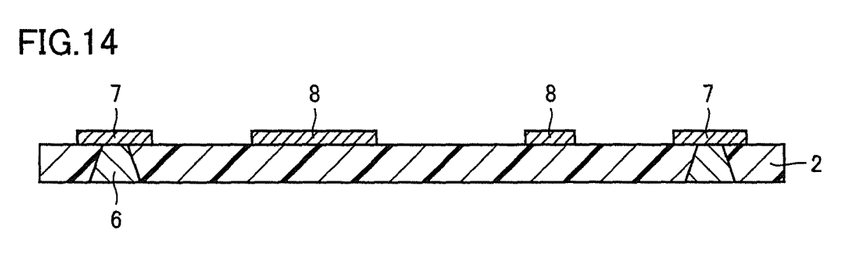
FIG. 14 is a sixth diagram for describing the method for manufacturing the flexible multilayer substrate according to another preferred embodiment of the present invention.

Next, as shown in FIG. 14, a conductive paste is filled into via hole 11 by screen printing and the like. Screen printing is performed from the lower surface in FIG. 14. Although via hole 11 is oriented downward in FIGS. 13 and 14 for convenience in description, the orientation may be changed as appropriate and screen printing may be performed actually. The filled conductive paste may contain silver as a main ingredient as described above. However, instead of silver, the conductive paste may contain, for example, copper as a main ingredient. This conductive paste preferably contains an appropriate amount of metal powder that forms an alloy layer with the metal that is the material of conductor pattern 7 at a temperature when the stacked resin layers are thermally compressed subsequently. This conductive paste contains copper, i.e., Cu as a main ingredient for causing the conductivity to work. This conductive paste preferably contains at least one of Ag, Cu and Ni and at least one of Sn, Bi and Zn. Via conductor 6 is thus formed as shown in FIG. 14.

Resin layers 2 shown in FIG. 14 are stacked and thermally compressed. Flexible multilayer substrate 101 shown in FIG. 1 is thus obtained. The flexible multilayer substrates described in the other preferred embodiments can be similarly obtained by changing the arrangement and thickness of conductor pattern 8 as appropriate.

When the flexible multilayer substrate is the rigid-flexible multilayer substrate, the rigid portion and the flexible portion may be different in the number of resin layers. In this case, the same number of resin layers may be stacked, and thereafter, an unnecessary portion may be removed.

The preferred embodiments disclosed herein are illustrative and not limitative in any respect. The scope of the present invention is defined by the terms of the claims, rather than the description above, and is intended to include any modifications within the scope and meaning equivalent to the terms of the claims.

The preferred embodiments of the present invention can be used for a flexible multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible multilayer substrate, comprising:
    a stacked body including a plurality of stacked resin layers extending in a longitudinal direction and defining a flexible portion; wherein
    the stacked body includes an innermost surface that is a surface located inside when both ends in the longitudinal direction are bent to come closer to each other, and an outermost surface that is a surface located outside when both ends in the longitudinal direction are bent to come closer to each other;
    a plurality of conductor patterns are arranged inside the stacked body and distributed over a surface of one or more of the plurality of resin layers;
    a portion located on an innermost surface side with respect to a center plane of the stacked body in a thickness direction is a first portion, a portion located on an outermost surface side with respect to the center plane of the stacked body in a thickness direction is a second portion, and an area having a minimum spacing along the longitudinal direction between the conductor patterns arranged on a same surface of a resin layer of the plurality of resin layers, is located in the second portion; and
    the stacked body includes an area having a spacing which extends along the longitudinal direction between the conductor patterns arranged on a same surface of a resin layer of the plurality of resin layers and which is larger than the minimum spacing.

2. The flexible multilayer substrate according to claim 1, wherein
    the plurality of resin layers include a resin layer having a first thickness and a resin layer having a second thickness larger than the first thickness; and among the plurality of resin layers, the resin layer having the first thickness is located closest to the outermost surface.

3. The flexible multilayer substrate according to claim 2, wherein inside the stacked body, all of the resin layers having the second thickness are located closer to the innermost surface than all of the resin layers having the first thickness.

4. The flexible multilayer substrate according to claim 1, wherein
the conductor patterns arranged in two or more different layers are distributed in each of the first portion and the second portion; and
a distance between the conductor patterns in the thickness direction is longer in the first portion than in the second portion.

5. The flexible multilayer substrate according to claim 1, wherein
at least one of the conductor patterns is distributed in each of the first portion and the second portion; and
a conductor pattern thicker than any of the conductor patterns located in the first portion is provided in the second portion.

6. The flexible multilayer substrate according to claim 1, wherein a density of the conductor patterns located in the second portion is higher than a density of the conductor patterns located in the first portion.

7. The flexible multilayer substrate according to claim 1, wherein a number of the conductor patterns located in the second portion is larger than a number of the conductor patterns located in the first portion.

8. The flexible multilayer substrate according to claim 1, further comprising at least one via conductor arranged to electrically connect at least two of the plurality of conductor patterns.

9. The flexible multilayer substrate according to claim 1, wherein the first portion does not include any of the plurality of conductor patterns.

10. The flexible multilayer substrate according to claim 1, wherein each of the first portion and the second portion include at least one of the plurality of conductor patterns.

11. The flexible multilayer substrate according to claim 1, wherein a density of the conductor patterns in the second portion is higher than a density of the conductor patterns in the first portion.

12. The flexible multilayer substrate according to claim 1, wherein the plurality of conductor patterns are unevenly distributed in the stacked body.

13. The flexible multilayer substrate according to claim 1, wherein a number of the conductor patterns in the second portion is greater than a number of the conductor patterns in the first portion.

14. The flexible multilayer substrate according to claim 1, wherein the stacked body defines a central portion of the flexible multilayer substrate.

* * * * *